(12) United States Patent
Wijeratne et al.

(10) Patent No.: US 7,952,941 B2
(45) Date of Patent: May 31, 2011

(54) METHOD AND APPARATUS FOR REDUCING LEAKAGE IN BIT LINES OF A MEMORY DEVICE

(75) Inventors: Sapumal B Wijeratne, Portland, OR (US); Eric Kwesi Donkoh, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 283 days.

(21) Appl. No.: 12/345,442

(22) Filed: Dec. 29, 2008

(65) Prior Publication Data

US 2010/0165753 A1 Jul. 1, 2010

(51) Int. Cl.
*G11C 7/00* (2006.01)
(52) U.S. Cl. ............... 365/189.11; 365/203; 365/228
(58) Field of Classification Search .......... 365/189.11, 365/203, 228, 154
See application file for complete search history.

(56) References Cited

U.S. PATENT DOCUMENTS

| 7,417,910 | B2 * | 8/2008 | Kang et al. | 365/203 |
| 7,668,035 | B2 * | 2/2010 | Chu et al. | 365/227 |
| 7,830,727 | B2 * | 11/2010 | Arsovski et al. | 365/189.15 |

* cited by examiner

*Primary Examiner* — David Lam
(74) *Attorney, Agent, or Firm* — Blakely, Sokoloff, Taylor & Zafman LLP

(57) ABSTRACT

A method and system to allow reduction of leakage in the bit lines of a memory device. In addition, minimal delay to the bit lines is introduced by the method and system. The memory device has a plurality of bit lines and a plurality of nodes to facilitate access of a respective one of the bit lines. A logic circuit that has a plurality of transistors and each transistor is coupled with the respective one of the bit lines and with a respective one of the nodes to reduce leakage of the bit lines when the transistors are deactivated. A just in time pre-charge method is also used to avoid the requirement of an additional pre-charge device to prevent excessive charge sharing while enabling the reduction of leakage of the bit lines.

15 Claims, 5 Drawing Sheets

| Signal | Rising edge | Falling edge |
|---|---|---|
| 520 Input clock | Ref 1 | Ref 2 |
| 530 Bit line enable | < Ref 1 | > Ref 2 |
| 515 Local clock | Ref 1 + 2 INV | Ref 2 + 2 INV |
| RdWL | Ref 1 + 4 INV | Ref 2 + 4 INV |
| 162 Activation signal of pre-charge device | Ref 1 + 4 INV | Ref 2 + 4 INV |
| 312 Enable 1 | Ref 1 + 2 INV | Ref 2 + 2 INV |

| | | Cycle 1 | | Cycle 2 | | Cycle 3 | | Cycle 4 | |
|---|---|---|---|---|---|---|---|---|---|
| | | No read | | Read 11th entry | | Read 50th entry | | No read | |
| LBL id | Entries | Pre-ch | Eval | Pre-ch | Eval | Pre-ch | Eval | Pre-ch | Eval |
| LBL 1 | 0:7 | En1=0 | En1=0 | En1=0 | En1=0 | En1=0 | En1=0 | En1=0 | En1=0 |
| LBL 2 | 8:15 | En2=0 | En2=0 | En2=1 | En2=1 | En2=0 | En2=0 | En2=0 | En2=0 |
| LBL 3 | 16:23 | En3=0 | En3=0 | En3=0 | En3=0 | En3=0 | En3=0 | En3=0 | En3=0 |
| LBL 4 | 24:31 | En4=0 | En4=0 | En4=0 | En4=0 | En4=0 | En4=0 | En4=0 | En4=0 |
| LBL 5 | 32:39 | En5=0 | En5=0 | En5=0 | En5=0 | En5=0 | En5=0 | En5=0 | En5=0 |
| LBL 6 | 40:47 | En6=0 | En6=0 | En6=0 | En6=0 | En6=0 | En6=0 | En6=0 | En6=0 |
| LBL 7 | 48:55 | En7=0 | En7=0 | En7=0 | En7=0 | En7=0 | En7=1 | En7=1 | En7=0 |
| LBL 8 | 56:63 | En8=0 | En8=0 | En8=0 | En8=0 | En8=0 | En8=0 | En8=0 | En8=0 |

METHOD AND APPARATUS FOR REDUCING LEAKAGE IN BIT LINES OF A MEMORY DEVICE

FIELD OF THE INVENTION

This invention relates to a memory device, and more specifically but not exclusively, to the reduction of leakage in bit lines of the memory device.

BACKGROUND DESCRIPTION

Memory devices consume static power because of leakage through its transistors. To counter the leakage problem, low leakage (high dielectric constant) transistors and circuit techniques have been used.

FIG. 1 shows a prior art register file 100. The local bit line (LBL) 1 140 is a distributed domino (typically 8:1) multiplexer and is connected to several adjacent one bit cells 110 and 120 in LBL block 1 101. The LBL 1 140 can be merged with LBL 2 145 using a two input AND NOT (NAND) gate 185. The output of the NAND gate 185 is sent to a global bit line 182 that merges many LBLs along a memory column.

The access of the one bit cells 110 and 120 are controlled by read word line (RdWL). During the pre-charge phase of the LBLs 140 and 145, pre-charge devices 160 and 170 pull up the voltage level of the LBLs 140 and 145 respectively. The voltage level of the LBLs 140 and 145 is typically pulled up to the voltage supply $V_{CC}$ 190 of the register file 100. When register file 100 is inactive, the RdWL of each one bit cell 110 and 120 deactivates transistors 112 and 122 respectively and the data stored in each one bit cell 110 and 120 cannot be accessed by the LBLs 140 and 145.

Static power consumption of the register file 100 can occur through the leakage of transistors 112 and 122. For example, when LBL 1 140 is pre-charged to $V_{CC}$, when the transistors 112 and 122 are deactivated by the RdWLs of the one bit cells 110 and 120 respectively, and when the transistors 114 and 124 are activated by the data stored in the one bit cells 110 and 120 respectively, leakage via transistors 112 and 122 can occur. This is because the drain and source terminal of transistors 112 and 122 are at $V_{CC}$ and at ground potential respectively.

FIG. 2 shows a prior art register file 200 with a transistor 210 added to reduce the leakage of the LBL 140. The source terminal of transistors 114 and 124 are connected to the drain terminal of transistor 210. Capacitors 212 and 214 represent the equivalent capacitance seen by LBL 1 140 and LBL 2 145 respectively. When register file 200 is inactive, transistor 210 is deactivated to reduce the leakage of transistors 112 and 122. Unlike the earlier example where the source terminal of transistors 112 and 122 are at ground potential, a deactivated transistor 210 can provide leakage reduction by disconnecting the path of the source terminal of transistors 112 and 122 to the ground terminal.

However, the circuit technique used in register file 200 has several flaws. The transistor 210 weakens the pull-down network of the one bit cells 110 and 120 since the charge on the capacitor 212 has to go through transistor 210. To compensate for the delay caused by the weakening of the pull-down network, transistor 210 is typically made three times larger than the typical transistor in register file 200. A virtual $V_{SS}$ track 211 is also required to connect transistors 114 and 124 to transistor 210. In addition, the increase in size of transistor 210 to compensate the delay can also cause the leakage of transistor 210 to increase and it offsets the leakage reduction of transistors 112 and 122.

BRIEF DESCRIPTION OF THE DRAWINGS

The features and advantages of embodiments of the invention will become apparent from the following detailed description of the subject matter in which:

FIG. 6 illustrates a table of the signal timings of FIG. 5 in accordance with one embodiment of the invention;
FIG. 7 illustrates the operation of the invention in accordance with one embodiment of the invention.

DETAILED DESCRIPTION

Reference in the specification to "one embodiment" or "an embodiment" of the invention means that a particular feature, structure or characteristic described in connection with the embodiment is included in at least one embodiment of the invention. Thus, the appearances of the phrase "in one embodiment" appearing in various places throughout the specification are not necessarily all referring to the same embodiment.

Embodiments of the invention allow reduction of leakage in the bit lines of a memory device. In addition, minimal delay to the bit lines is introduced by embodiments of the invention. The memory device includes, but is not limited to, a read only memory (ROM), a branch register file, a predicate register file, an integer register file, a general purpose register file, a floating point file, or any other form of an array of data storing registers. The bit lines include, but are not limited to, local bit lines or global bit lines. Although embodiments of the invention described herein are primarily directed to local bit lines, one of ordinary skill in the relevant art will readily appreciate that the embodiments of the invention can also be directed to global bit lines as well.

Figure 3:
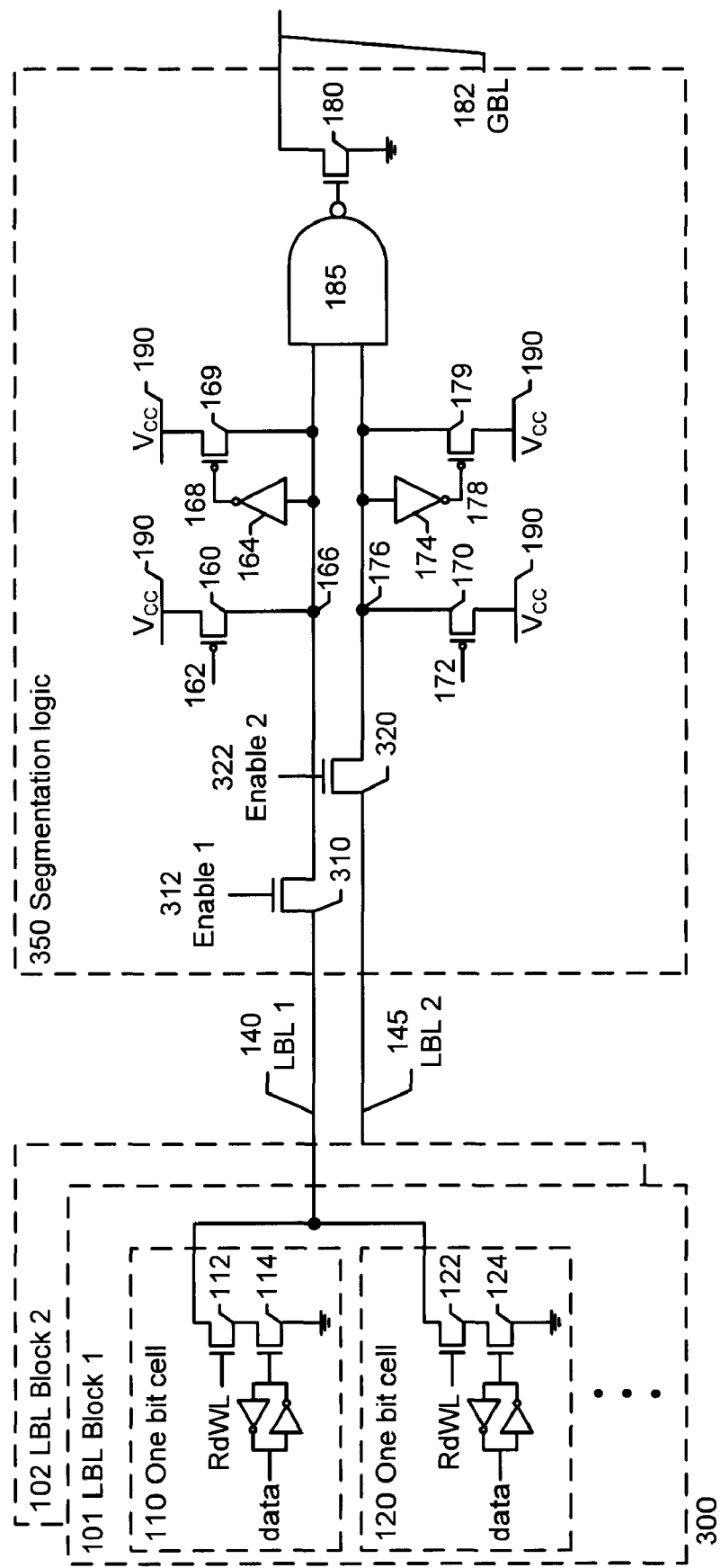
FIG. 3 illustrates a memory device in accordance with one embodiment of the invention.

FIG. 3 illustrates a memory device 300 in accordance with one embodiment of the invention. The memory device 300 has a global bit line 182 that is connected with a segmentation logic block 350 via transistor 180. The LBL block 1 101 and LBL block 2 102 are connected with the segmentation logic block 350 via LBL 1 140 and LBL 2 145 respectively. One of ordinary skill in the relevant art will readily appreciate that other logic or devices may also be connected with memory device 300 to enable its operation. For the sake of clarity, only the relevant or salient parts of the circuitry of the memory device 300 are discussed herein. For example, LBLs 140 and 145 are each connected with an enabling signal or logic that is not illustrated in FIG. 3.

The LBL block 1 140 has two one bit cells 110 and 120. In one embodiment, the number of one bit cells in LBL block 1

140 is a factor or a multiple of the entry of the memory device 300. For example, if the number of entries of the memory device 300 is 64 entries, the number of one bit cells in LBL block 140 can be 8, 16, 32, 64, or any other combinations. The LBL block 2 102 can have identical or different configuration as LBL block 1 101. Although only two LBL blocks 101 and 102 have been depicted in FIG. 3, memory device 300 can have any number of LBL blocks.

The one bit cell 110 has two transistors 112 and 114 connected in series, i.e., the source terminal of transistor 112 is connected to the drain terminal of transistor 114. The gate and drain terminal of transistor 112 are connected to the read word line (RdWL) and to the LBL 1 140 respectively. The RdWL of one bit cell 110 controls the read access of one bit cell 110. The data of the one bit cell 110 is stored at the gate terminal of transistor 114 via two back-to-back connected inverters. The one bit cell 120 has the same structure as one bit cell 110. Both one bit cells 110 and 120 are connected to the LBL 1 140 and LBL block 1 101 allows only a single one bit cell to be active at any one time. This means that only one RdWL in LBL block 1 101 can activate the access of the selected one bit cell, while the rest of the RdWLs in the other non-selected one bit cells are deactivated.

Segmentation logic block 350 has several components, namely, the transistors 310 and 320, the pre-charge devices 160 and 170, the keeper devices 169 and 179, the two input NAND gate 185, the inverters 164 and 174, and the transistor 180 that connects NAND gate 185 to GBL 182. The pre-charge device 160 of LBL 1 140 is connected with the node 166. When transistor 310 is activated, the pre-charge device 160 pulls up the voltage level of the LBL 1 140 during the pre-charge phase. The keeper device 169 is also activated during the pre-charge phase via inverter 164. Similarly, the pre-charge device 170 of LBL 2 145 is connected with the node 176. When transistor 320 is activated, the pre-charge device 170 pulls up the voltage level of the LBL 2 145 during the pre-charge. The keeper device 179 is also activated during the pre-charge phase via inverter 174.

In one embodiment of the invention, the pre-charge devices 160 and 170 are single transistors. In other embodiments, other logic may also be used to pull up the voltage level of the LBLs 140 and 145. The gate and drain terminal of pre-charge device 160 are connected with an activation signal 162 and a voltage supply 190 respectively. Similarly, the gate and drain terminal of pre-charge device 170 are connected with an activation signal 172 and the voltage supply 190 respectively. In one embodiment of the invention, the voltage supply 190 is connected to the voltage supply $V_{CC}$ of the memory device 300.

The source terminal of pre-charge devices 160 and 170 are connected with the LBL1 140 and the LBL 2 145 respectively. In one embodiment of the invention, when activation signal 162 activates pre-charge device 160, the LBL 1 140 is pulled up to the voltage level of $V_{CC}$-$V_{TH}$. Similarly, when activation signal 172 activates pre-charge device 170, the LBL 2 145 is pulled up to the voltage level of $V_{CC}$-$V_{TH}$.

The keeper devices 169 and 179 are also connected with the nodes 166 and 176 respectively. When transistors 310 and/or 320 are activated, the keeper devices 169 and 179 maintain the voltage level of the LBL 1 140 and LBL 2 145 respectively. During the pre-charge phase of the LBL 1 140, the LBL 1 140 is set to logic one. The input of the inverter 164 is LBL 1 140 and the output of the inverter 164 is inverted to logic zero. The activation signal 168 of the keeper device 169 is connected to the output of the inverter 164 and the keeper device 169 is activated when the LBL 1 140 is set to logic one as activation signal 168 is an active low signal. Similarly, during the pre-charge phase of the LBL 2 145, the LBL 2 145 is set to logic one. The input of the inverter 174 is LBL 2 145 and the output of the inverter 174 is inverted to logic zero. The activation signal 178 of the keeper device 179 is connected to the output of the inverter 174 and the keeper device 179 is activated when the LBL 2 145 is set to logic one as activation signal 178 is an active low signal.

In one embodiment of the invention, the keeper devices 169 and 179 are single transistors. In other embodiments, other logic may also be used to maintain the voltage level of the LBLs 140 and 145. The source and drain terminal of keeper device 169 are connected with the node 166 and a voltage supply 190 respectively. Similarly, the source and drain terminal of keeper device 179 are connected with the node 176 and a voltage supply 190 respectively.

Although the voltage supply 190 of pre-charge devices 160 and 170 and keeper devices 169 and 179 are shown as connected to the voltage supply of the memory device $V_{CC}$, in other embodiments, the voltage supply 190 of pre-charge devices 160 and 170 and keeper devices 169 and 179 can also be connected to different voltage supplies. The source terminal of keeper device 169 is connected with the LBL 1 140 when transistor 310 is activated. In one embodiment of the invention, when activation signal 168 activates keeper device 169, the LBL 1 140 is maintained at the voltage level of $V_{CC}$-$V_{TH}$ when transistor 310 is activated. $V_{TH}$ is the threshold voltage level of transistor 310. When the enable signal 1 312 is set to $V_{CC}$ to turn on transistor 310, the voltage level of LBL 1 140 will be at $V_{CC}$-$V_{TH}$ since the node 166 is maintained at $V_{CC}$ by keeper device 169. The voltage level drop of $V_{TH}$ at LBL 1 140 is required to turn on transistor 310. Similarly, when the enable signal 2 322 is set to $V_{CC}$ to turn on transistor 320, the voltage level of LBL 2 145 will be at $V_{CC}$-$V_{TH}$. The operation of keeper device 179 is similar to the operation of keeper device 169 and shall not be repeated herein.

During each evaluation phase of the LBLs 140 and 145, transistors 310 and 320 are activated to facilitate access of the LBLs 140 and 145. When one bit cell 110 is to be accessed for example, RdWL of one bit cell 110 activates transistor 112. If a logic zero is stored at the input of transistor 114 in the one bit cell 110, transistor 114 will not be activated and LBL 1 140 will be maintained at the voltage level of $V_{CC}$-$V_{TH}$ by keeper device 169. If a logic one is stored in the one bit cell 110, transistor 114 will be activated and LBL 1 140 will be pulled to ground potential as there is a path from voltage supply 190 to the ground terminal via activated transistors 112 and 114.

Figure 1:
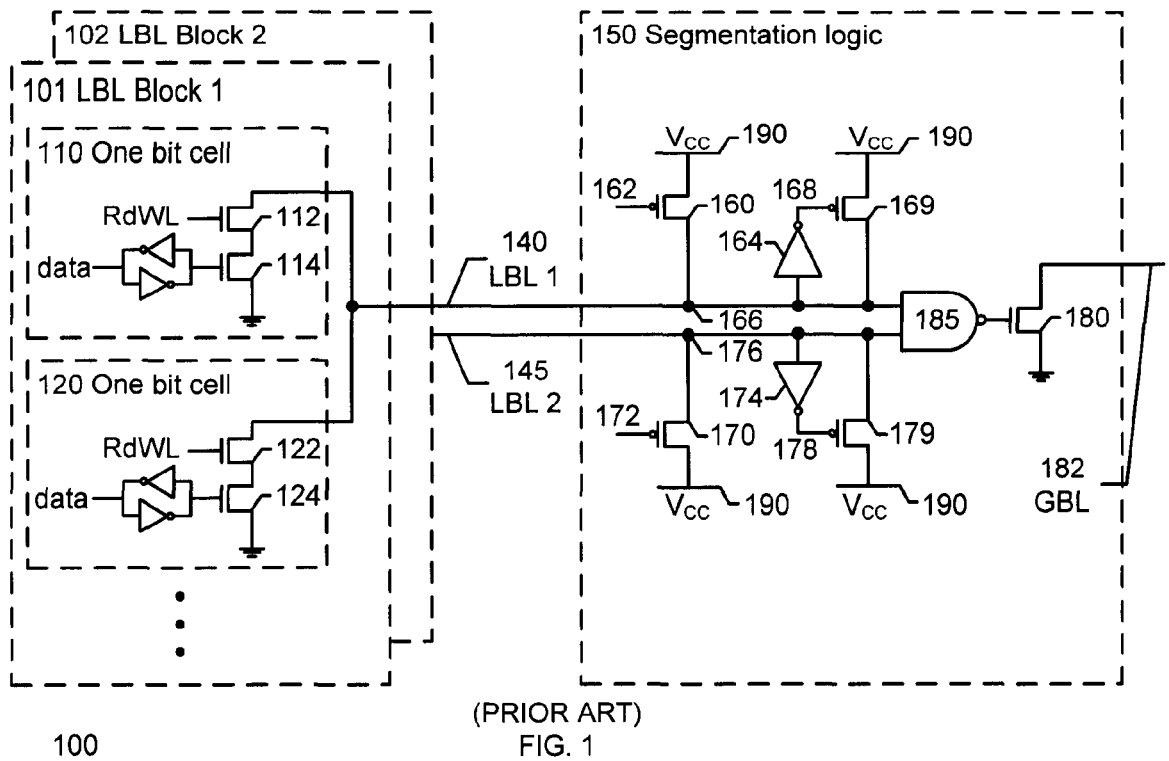
FIG. 1 illustrates a prior art register file.
Figure 2:
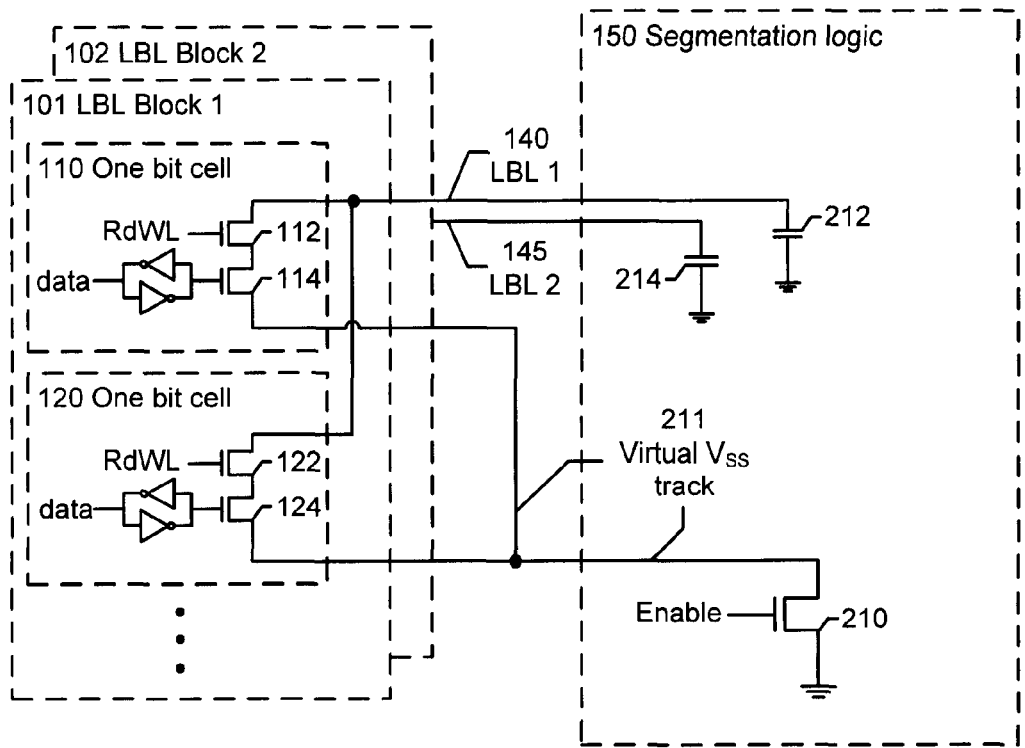
FIG. 2 illustrates a prior art register file.

Transistors 310 and 320 avoid the disadvantages of the prior art register file 200 as described earlier in FIG. 2. The source terminal of transistors 310 and 320 are connected with LBL 1 140 and LBL 2 145 respectively. The drain terminal of transistors 310 and 320 are connected with node 166 and node 176 respectively. One of ordinary skill in the relevant skill will appreciate that the connection of the transistors 310 and 320 source can be swapped, i.e., the connection of the source terminal can be swapped with the connection of the drain terminal. The nodes 166 and 176 facilitate access of LBL 1 140 and LBL 2 145 respectively.

During the pre-charge phase of memory device 300, the enable signal 1 312 and the enable signal 2 322 deactivate transistors 310 and 320 respectively. In the high leakage scenario where transistors 112 and 122 are deactivated by their respective RdWL, and where transistors 114 and 124 are activated by the data stored in one bit cells 110 and 120, transistors 310 and 320 reduce leakage of LBL1 140 and LBL 2 145 respectively when they are deactivated. This is because the voltage level of LBL 1 140 will move to an equilibrium voltage level where the leakage current through transistors 112 and 310 is equalized when transistor 310 is deactivated, i.e., LBL 1 140 is floating or unconnected. The equilibrium voltage of LBL 1 140 converges to a level close to $V_{SS}$ or close to ground potential. The voltage level of LBL 2 145 similarly converges to a level close to $V_{SS}$ or to ground potential.

Since the voltage level of LBL 1 140 is close to $V_{SS}$ or close to ground potential, the drain terminal of transistors 112 and 122 is also close to $V_{SS}$ or close to ground voltage level as LBL1 140 is connected to the drain terminal of transistors 112 and 122. The leakage current through transistors 112 and 122 is reduced significantly as the voltage level difference between the drain terminal and the source terminal of transistors 112 and 122 is small. This technique has an advantage as the sizes of the transistors 310 and 320 do not have to be three times bigger than the typical transistor size in the memory device 300. The delay introduced by the addition of transistors 310 and 320 is minimal as LBLs 140 and 145 are pre-charged to $V_{CC}$-$V_{TH}$.

Figure 4:
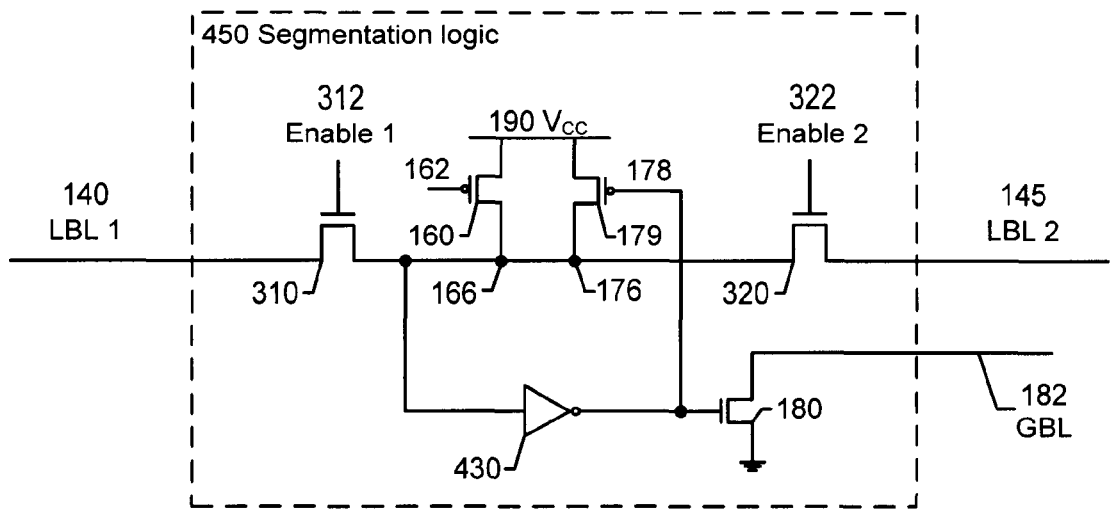
FIG. 4 illustrates a segmentation logic block of a memory device in accordance with one embodiment of the invention.

FIG. 4 illustrates a segmentation logic block 450 of a memory device 400 in accordance with one embodiment of the invention. The segmentation logic block 450 requires lesser chip area to implement than segmentation logic block 350. The segmentation logic block 450 is area optimized to perform identical functions as segmentation logic block 350. The function(s) of the transistors 310 and 320, the pre-charge device 160, the keeper device 179, and the transistor 180 in FIG. 4 has been discussed earlier and shall not be repeated herein.

The NAND gate 185 of FIG. 3 is replaced with an inverter 430 in FIG. 4. The enable signals 312 and 322 are multiplexed (not shown) such that only one enable signal can be active at any one time. The output of the inverter 430 drives the keeper device 179. The voltage supply 190 of the pre-charge device 160 and keeper device 179 are connected together. In one experimental study, the segmentation logic block 450 can reduce the number of required devices by about 50% and reduces the foot print by about 40% when compared to segmentation logic block 350.

In the design of segmentation logic blocks 350 and 450, although transistors 310 and 320 are able to reduce the leakage of the LBLs 140 and 145 respectively, excessive charge sharing between the transistor node connected to keeper devices 169 and 179 and the LBLs 140 and 145 may result in noise failure during the evaluation phase of memory devices 300 and 400. For example, during the evaluation phase of LBL 1 140, the pre-charge device 160 is deactivated and the keeper device 169 maintains the voltage level of the node 166 at $V_{CC}$. The voltage level of LBL 1 140 is close to $V_{SS}$ or close to ground potential during the pre-charge phase as discussed earlier and it remains close to $V_{SS}$ or close to ground potential prior to the evaluation phase. When transistor 310 is activated by the enable signal 1 312 during the evaluation phase of LBL 1 140, charge sharing between the node 166 and the LBL 1 140 may occur as there is a potential difference. The charge sharing may cause the keeper device 169 to turn off and result in noise failure.

One possible but non-ideal solution is to have additional pre-charge devices each connected with the LBLs 140 and 145 to ensure that both the source and drain terminal of the transistors 310 and 320 are at $V_{CC}$ to ensure that there is no charge sharing. However, if another pre-charge device is each added to the LBLs 140 and 145, there will be no leakage reduction of the bit lines. In one embodiment of the invention, a just in time (JIT) pre-charge method is used to address the charge sharing problem. The enable signals 312 and 322 activate transistors 310 and 320 prior to the deactivation of the pre-charge devices 160 and 170 respectively. When transistors 310 and 320 are activated, the LBLs 140 and 145 are pulled to the voltage level of $V_{CC}$-$V_{TH}$ by the pre-charge devices 160 and 170 respectively prior to the start of the evaluation phase of LBLs 140 and 145.

At the start of the evaluation phase of memory devices 300 and 400, the LBLs 140 and 145 have a voltage level of $V_{CC}$-$V_{TH}$. When transistor 112 is activated by the RdWL of transistor 112 during the evaluation phase of LBL 1 140, the potential difference between the node 166 and the LBL 1 140 is $V_{TN}$. Since $V_{TN}$ is a small voltage level that causes minimal charge sharing, no noise failure will occur. The JIT pre-charge method avoids the requirement of an additional pre-charge device to prevent excessive charge sharing while enabling the reduction of leakage of the bit lines.

Figure 5:
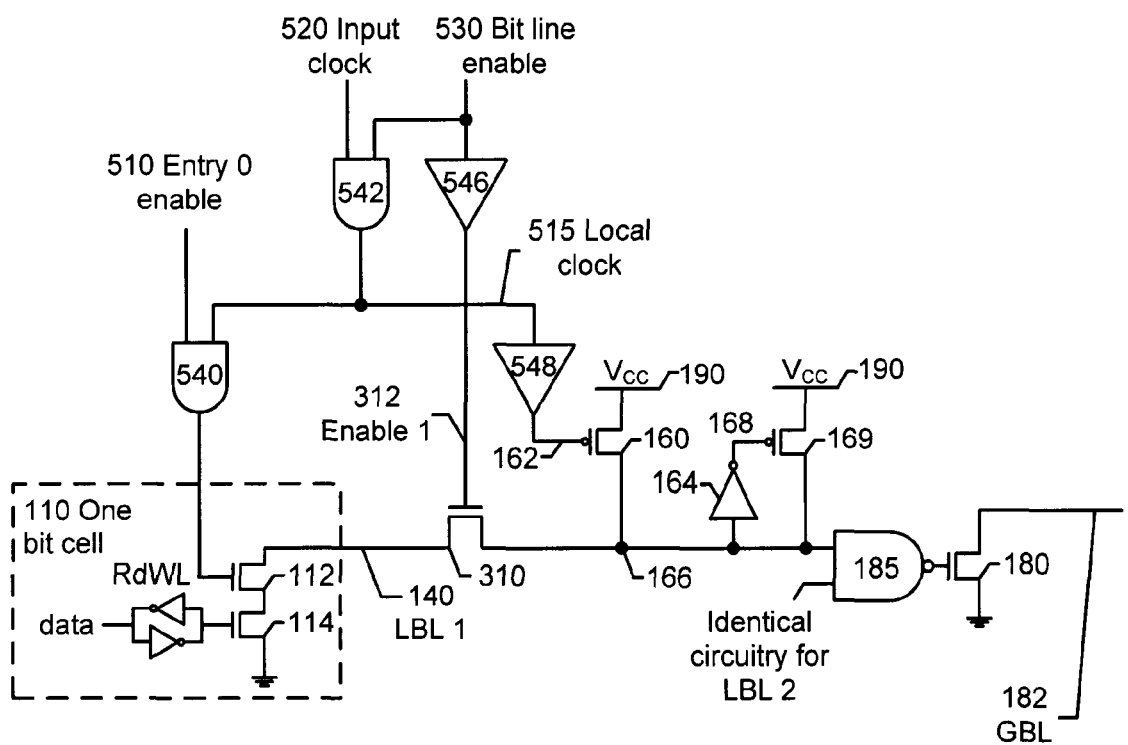
FIG. 5 illustrates an implementation of a circuit to enable the just in time pre-charge method in accordance with one embodiment of the invention.

FIG. 5 illustrates an implementation of a circuit 500 to enable the JIT pre-charge method in accordance with one embodiment of the invention. For the sake of clarity, circuit 500 shows the logic required for the JIT pre-charge method for LBL 1 140 in memory device 300. The logic required for JIT pre-charge method for LBL 2 145 is similar and one of ordinary skill in the relevant art can apply the same logic for LBL 2 145. In addition, only a single one bit cell 110 is illustrated in FIG. 500. The logic required for other one bit cells are similar and shall not be repeated herein for the sake of clarity.

The bit line enable signal 530 controls the access of the LBL 1 140 and the entry 0 enable signal 510 controls the access of the one bit cell 110. The bit line enable signal 530 goes through buffer 546 and becomes the enable signal 1 312 of transistor 310. The input clock 520 of memory device 300 is gated with the bit line enable signal 530 using the two input AND gate 542. The output of AND gate 542 becomes the local clock 515. The local clock 515 goes through buffer 548 and becomes the activation signal 162 of pre-charge device 160. The local clock 515 is gated with the entry 0 enable signal 510 using the two input AND gate 540 to become the RdWL of one bit cell 110. The circuit 500 allows the activation of the transistor 310 prior to the deactivation of the pre-charge device 160 to reduce charge sharing between the LBL 1 140 and the node 166. The circuit 500 can also be implemented in the segmentation logic 450 of FIG. 4 to achieve the JIT pre-charge method.

FIG. 6 illustrates a table 600 of the signal timings of FIG. 5 in accordance with one embodiment of the invention. Table 600 shows an example of the signals discussed in FIG. 5 and the timing of their rising and falling edges. In the example, the AND gates 540 and 542, and the buffers 546 and 548 are each assumed to have a delay equivalent to two inverter (INV) delays, i.e., the time required for a signal to pass through two INVs.

The time reference of the signals is considered with respect to the rising and falling edges of input clock 520. The rising edge of input clock 520 is assumed to be at time reference 1 (Ref 1) and the failing edge of input clock 520 is assumed to be at time reference 2 (Ref 2). The rising edge of bit line enable signal 530 is activated prior to Ref 1 (<Ref 1) to meet the setup time requirement of the AND gate 542. Similarly, the falling edge of the line enable signal 530 is deactivated after Ref 2 (>Ref 2) to meet the hold time requirement of the AND gate 542. The rising edge of local clock 515 is delayed by two INV delays (Ref 1+2 INV) due to the delay of AND gate 542. Similarly, the falling edge of local clock 515 is delayed by two INV delays (Ref 2+2 INV) due to the delay of AND gate 542.

The rising edge of RdWL of one bit cell 110 is delayed by four INV delays (Ref 1+4 INV) due to the combined delay of AND gates 540 and 542. Similarly, the falling edge of RdWL of one bit cell 110 is delayed by four INV delays (Ref 2+4 INV) due to the combined delay of AND gates 540 and 542. The rising edge of the activation signal of pre-charge device 160 is delayed by four INV delays (Ref 1+4 INV) due to the combined delay of AND gate 542 and buffer 548. Similarly, the falling edge of the activation signal of pre-charge device 160 is delayed by four INV delays (Ref 2+4 INV) due to combined delay of AND gate 542 and buffer 548. The rising edge of the enable signal 1 312 of transistor 310 is delayed by two INV delays (Ref 1+2 INV) due to the delay of buffer 546. Similarly, the falling edge of the enable signal 1 312 of transistor 310 is delayed by two INV delays (Ref 2+2 INV) due to buffer 546.

The example in table 600 shows that the activation of the transistor 310 occurs two inversions prior to the deactivation of the pre-charge device 160 to reduce charge sharing between the LBL 1 140 and the node 166. Although the example in table 600 shows a delay of two INV delays activation between the activation of transistor 310 and the deactivation of the pre-charge device 160, this is not meant to be limiting. The AND gates 540 and 542, and the buffers 546 and 548 can have any amount of delay or no delay at all.

FIG. 7 illustrates the operation of the invention in accordance with one embodiment of the invention. Table 700 illustrates the operation of a register file with sixty four entries in four clock cycles. There are eight LBLs and each LBL has eight one bit cells to make up a total of sixty four entries. For example, LBL 1 has eight entries (0:7), LBL 2 has another eight entries (8:15) and so on. Each LBL has a transistor 310 connected to reduce the leakage of each LBL when the transistor 310 is deactivated.

In cycle 1, no read access is performed and all the enable signals of the transistors 310 of LBL 1 to LBL 8 are deasserted (En[1:8]=0). In cycle 2, the 11th entry of the register file is accessed and therefore the enable signal of transistor 310 of LBL 2 is asserted to logic one (En2=1) during the evaluation (eval) phase. In cycle 3, the 50th entry is accessed and therefore the enable signal of transistor 310 of LBL2 is asserted to logic zero (En2=0) and the enable signal of transistor 310 of LBL7 is asserted to logic one (En7=1) during the evaluation phase. In cycle 4, no read access is performed and the enable signal of the transistor 310 of LBL 7 remains at logic one (En7=1) during the pre-charge (pre-ch) phase and is asserted to logic zero (En7=0) during the evaluation phase. From the example from table 700, the dominant state of any LBL is in its lowest leakage state with the enable signal of transistor 310 of each LBL asserted to logic zero. A LBL is brought to the high leakage state only when it is known through the partial decoding of the read address that a particular LBL is needed for the next read.

Figure 8:
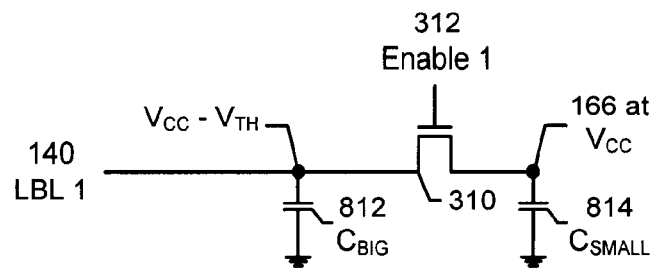
FIG. 8 illustrates a simplified version of the memory device of FIG. 3 in accordance with one embodiment of the invention.

FIG. 8 illustrates a simplified version of the memory device 300 in accordance with one embodiment of the invention. For the sake of clarity, LBL 2 145, LBL blocks 101 and 102, and the other logic connected to node 166 are not shown in FIG. 8. Capacitor $C_{BIG}$ 812 represents the equivalent capacitance seen by LBL 1 140 and capacitor $C_{SMALL}$ 814 represents the equivalent capacitance seen by the node 166. During the pre-charge phase of LBL1 140, node 166 is pulled to voltage level $V_{CC}$ by pre-charge device 160 in one embodiment of the invention. Therefore, the maximum voltage level that $C_{SMALL}$ 814 can be charged to is $V_{CC}$. Since transistor 310 is connected in series with LBL1 140 and node 166, there will be a voltage level drop of $V_{TH}$ at $C_{BIG}$ 812 when transistor 310 is activated. Therefore, the maximum voltage level that $C_{BIG}$ 812 can be charged to is voltage level $V_{CC}$-$V_{TH}$.

When memory device 300 is compared to the prior art register file 100, less current will be discharged via LBL 1 140 as the voltage level on LBL 1 140 is reduced by $V_{TH}$ for memory device 300. The total charge to be discharged via LBL 1 140 is $(V_{CC}-V_{TN})*C_{BIG}+(V_{CC})*C_{SMALL}$ for the memory device 300. The total charge to be discharged via LBL 1 140 for prior art register file 100 is $(V_{CC})*C_{BIG}$. Therefore the delay increase of memory device 300 compared to the prior art register file 100 is smaller than expected by $V_{TN}*C_{BIG}$ due to the LBL 1140 precharged to $V_{CC}-V_{TN}$. For this reason the delay penalty of inserting transistor 310 is minimal.

In one embodiment of the invention, memory devices 300 and 400 allow reduction of leakage of their bit lines and at the same time, improve the operational frequency. In one embodiment of the invention, all the transistors described herein are implemented using either N-channel Metal Oxide Semiconductor (NMOS) field effect transistor (FET) or P-channel MOS FET (PMOS). In another embodiment, the transistors described herein may be implemented using any combination of PMOS and/or NMOS transistors. In other embodiments, the transistors may be also replaced with other devices that have a similar switching ability as the transistor.

Figure 9:
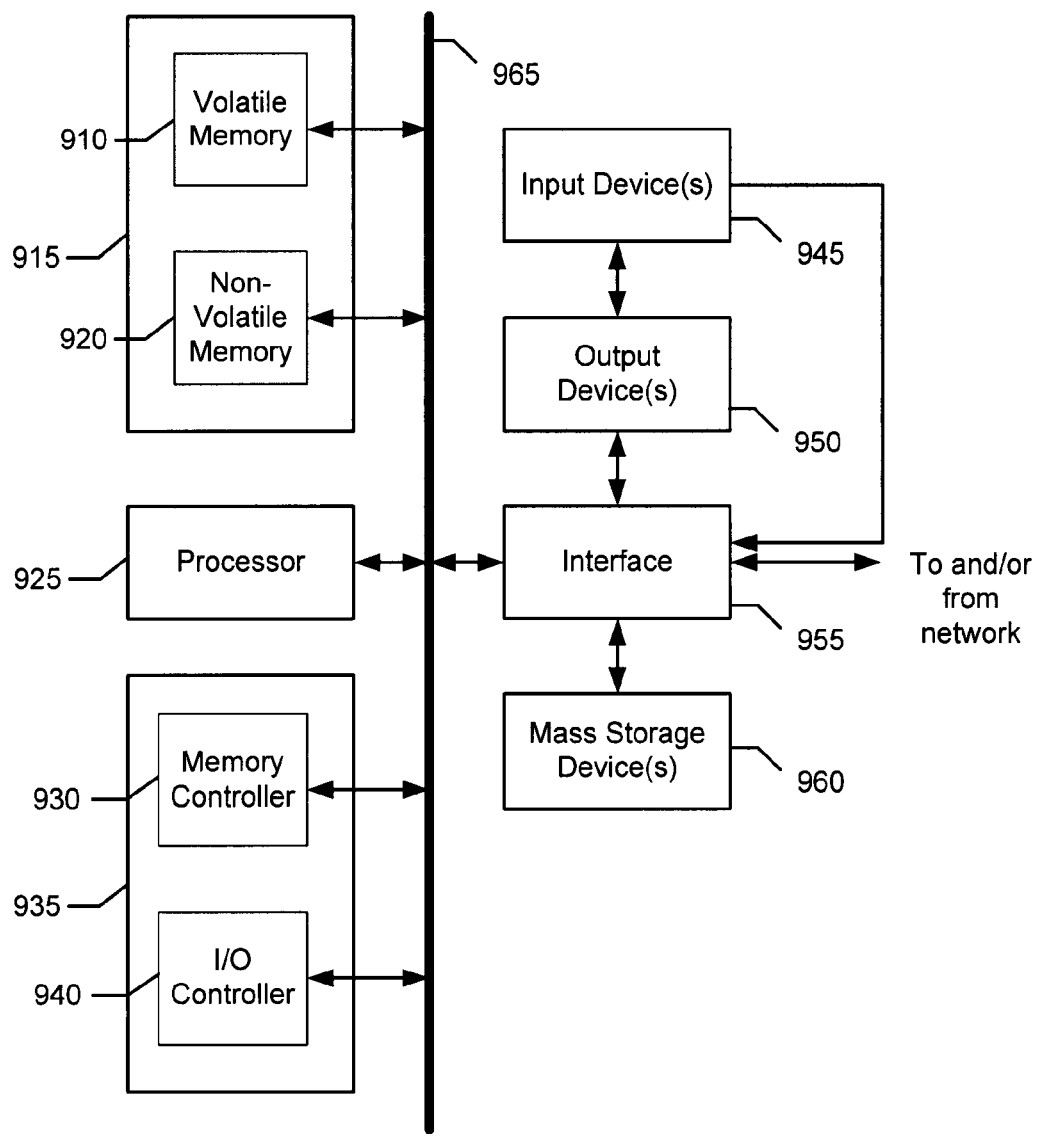
FIG. 9 illustrates a block diagram of a system to implement the methods disclosed herein in accordance with one embodiment of the invention.

FIG. 9 illustrates a block diagram of a system 900 to implement the methods disclosed herein according to an embodiment. The system 900 includes but is not limited to, a desktop computer, a laptop computer, a notebook computer, a personal digital assistant (PDA), a server, a workstation, a cellular telephone, a mobile computing device, an Internet appliance or any other type of computing device. In another embodiment, the system 900 used to implement the methods disclosed herein may be a system on a chip (SOC) system.

The system 900 includes a chipset 935 with a memory controller 930 and an input/output (I/O) controller 940. A chipset typically provides memory and I/O management functions, as well as a plurality of general purpose and/or special purpose registers, timers, etc. that are accessible or used by the processor 925. The processor 925 may be implemented using one or more processors and each processor has the memory devices 300 and/or 400.

The memory controller 930 performs functions that enable the processor 925 to access and communicate with a main memory 915 that includes a volatile memory 910 and a non-volatile memory 920 via a bus 965. The volatile memory 910 includes, but is not limited to, Synchronous Dynamic Random Access Memory (SDRAM), Dynamic Random Access Memory (DRAM), RAMBUS Dynamic Random Access Memory (RDRAM), and/or any other type of random access memory device. The non-volatile memory 920 includes, but is not limited by, flash memory, ROM, EEPROM, and/or any other desired type of memory device.

Memory 915 stores data and instructions to be executed by the processor 925. Memory 915 may also stores temporary variables or other intermediate data while the processor 925 is executing instructions. The system 900 includes, but is not limited to, an interface circuit 955 that is coupled with bus 965. The interface circuit 955 is implemented using any type of well known interface standard including, but is not limited to, an Ethernet interface, a universal serial bus (USB), a third generation input/output interface (3GIO) interface, and/or any other suitable type of interface.

One or more input devices 955 are connected to the interface circuit 955. The input device(s) 945 permit a user to enter data and commands into the processor 925. For example, the input device(s) 945 is implemented using, but is not limited to, a keyboard, a mouse, a touch-sensitive display, a track pad, a track ball, and/or a voice recognition system. One or more output devices 950 connect to the interface circuit 955. For example, the output device(s) 950 are implemented using, but are not limited to, light emitting displays (LEDs), liquid crystal displays (LCDs), cathode ray tube (CRT) displays, printers and/or speakers). The interface circuit 955 includes a graphics driver card.

The interface circuit 955 includes a communication device such as a modem or a network interface card to facilitate exchange of data with external computers via a network. The communication link between the system 900 and the network may be any type of network connection such as an Ethernet connection, a digital subscriber line (DSL), a telephone line, a cellular telephone system, a coaxial cable, etc.

Access to the input device(s) 945, the output device(s) 950, and/or the network is typically controlled by the I/O controller 940 in a conventional manner. In particular, the I/O controller 940 performs functions that enable the processor 925 to communicate with the input device(s) 945, the output device(s) 950 and/or the network via the bus 965 and the interface circuit 955.

While the components shown in FIG. 9 are depicted as separate blocks within the system 900, the functions performed by some of these blocks may be integrated within a single semiconductor circuit or may be implemented using two or more separate integrated circuits. For example, although the memory controller 930 and the I/O controller 940 are depicted as separate blocks within the chipset 935, one of ordinary skill in the relevant art will readily appreciate that the memory controller 930 and the I/O controller 940 may be integrated within a single semiconductor circuit.

Although examples of the embodiments of the disclosed subject matter are described, one of ordinary skill in the relevant art will readily appreciate that many other methods of implementing the disclosed subject matter may alternatively be used. In the preceding description, various aspects of the disclosed subject matter have been described. For purposes of explanation, specific numbers, systems and configurations were set forth in order to provide a thorough understanding of the subject matter. However, it is apparent to one skilled in the relevant art having the benefit of this disclosure that the subject matter may be practiced without the specific details. In other instances, well-known features, components, or modules were omitted, simplified, combined, or split in order not to obscure the disclosed subject matter.

Various embodiments of the disclosed subject matter may be implemented in hardware, firmware, software, or combination thereof, and may be described by reference to or in conjunction with program code, such as instructions, functions, procedures, data structures, logic, application programs, design representations or formats for simulation, emulation, and fabrication of a design, which when accessed by a machine results in the machine performing tasks, defining abstract data types or low-level hardware contexts, or producing a result.

While the disclosed subject matter has been described with reference to illustrative embodiments, this description is not intended to be construed in a limiting sense. Various modifications of the illustrative embodiments, as well as other embodiments of the subject matter, which are apparent to persons skilled in the art to which the disclosed subject matter pertains are deemed to lie within the scope of the disclosed subject matter.

What is claimed is:

1. A memory device comprising:
    a plurality of bit lines;
    a plurality of nodes, wherein each node is to facilitate access of a respective one of the bit lines;
    a logic circuit comprising:
        a plurality of transistors, each transistor coupled with the respective one of the bit lines and with a respective one of the nodes, wherein the transistors are to reduce leakage of the bit lines when deactivated; and
        at least one keeper device coupled with the respective one of the nodes to maintain the voltage level of each bit line during an evaluation phase of each bit line when a respective one of the transistors is activated; and
    at least one pre-charge device coupled with the respective one of the nodes to pull up a voltage level of each bit line during a pre-charge phase of each bit line when a respective one of the transistors is activated.

2. The memory device of claim 1, wherein each transistor is activated prior to a deactivation of the at least one pre-charge device to reduce charge sharing between the respective one of the bit lines and the respective one of the nodes.

3. The memory device of claim 1, wherein the memory device is one of a read only memory (ROM), a branch register file, a predicate register file, an integer register file, a general purpose register file or a floating point register file.

4. The memory device of claim 1, wherein the bit lines are local bit lines or global bit lines.

5. The memory device of claim 1, wherein a first terminal of each transistor is coupled with the respective one of the bit lines, wherein a second terminal of each transistor is coupled with the respective one of the nodes, and wherein the first and the second terminal is either a source or a drain terminal.

6. A processor comprising:
    a plurality of memory devices, each memory device comprising:
        a plurality of bit lines;
        a plurality of nodes, wherein each node is to facilitate access of a respective one of the bit lines;
        a logic circuit comprising:
            a plurality of transistors, each transistor coupled with the respective one of the bit lines and with a respective one of the nodes, wherein the transistors are to reduce leakage of the bit lines when deactivated; and
            at least one keeper device coupled with the respective one of the nodes to maintain the voltage level of each bit line during an evaluation phase of each bit line when a respective one of the transistors is activated; and
        at least one pre-charge device coupled with the respective one of the nodes to pull up a voltage level of each bit line during a pre-charge phase of each bit line when a respective one of the transistors is activated.

7. The processor of claim 6, wherein each transistor is activated prior to a deactivation of the at least one pre-charge device to reduce charge sharing between the respective one of the bit lines and the respective one of the nodes.

8. The processor of claim 6, wherein each memory device is one of a read only memory (ROM), a branch register file, a predicate register file, an integer register file, a general purpose register file or a floating point register file.

9. The processor of claim 6, wherein the bit lines are local bit lines or global bit lines.

10. The processor of claim 6, wherein a first terminal of each transistor is coupled with the respective one of the bit lines, wherein a second terminal of each transistor is coupled with the respective one of the nodes, and wherein the first and the second terminal is either a source or a drain terminal.

11. A system comprising:
    at least one processor, each processor comprising:

a plurality of memory devices, each memory device comprising:
  a plurality of bit lines;
  a plurality of nodes, wherein each node is to facilitate access of a respective one of the bit lines;
  a logic circuit comprising:
    a plurality of transistors, each transistor coupled with the respective one of the bit lines and with a respective one of the nodes, wherein the transistors are to reduce leakage of the bit lines when deactivated; and
    at least one keeper device coupled with the respective one of the nodes to maintain the voltage level of each bit line during an evaluation phase of each bit line when a respective one of the transistors is activated; and
  at least one pre-charge device coupled with the respective one of the nodes to pull up a voltage level of each bit line during a pre-charge phase of each bit line when a respective one of the transistors is activated.

12. The system of claim 11, wherein each transistor is activated prior to a deactivation of the at least one pre-charge device to reduce charge sharing between the respective one of the bit lines and the respective one of the nodes.

13. The system of claim 11, wherein each memory device is one of a read only memory (ROM), a branch register file, a predicate register file, an integer register file, a general purpose register file or a floating point register file.

14. The system of claim 11, wherein the bit lines of each memory device are local bit lines or global bit lines.

15. The system of claim 11, wherein a first terminal of each transistor is coupled with the respective one of the bit lines, wherein a second terminal of each transistor is coupled with the respective one of the nodes, and wherein the first and the second terminal is either a source or a drain terminal.

* * * * *